(12) United States Patent
Kusabiraki et al.

(10) Patent No.: US 8,501,389 B2
(45) Date of Patent: Aug. 6, 2013

(54) UPPER LAYER-FORMING COMPOSITION AND RESIST PATTERNING METHOD

(75) Inventors: Kazunori Kusabiraki, Tokyo (JP); Takahiro Hayama, Tokyo (JP); Norihiko Sugie, Tokyo (JP); Motoyuki Shima, Tokyo (JP); Kiyoshi Tanaka, Tokyo (JP)

(73) Assignee: JSR Corporation, Tokyo (JP)

(*) Notice: Subject to any disclaimer, the term of this patent is extended or adjusted under 35 U.S.C. 154(b) by 25 days.

(21) Appl. No.: 13/069,439

(22) Filed: Mar. 23, 2011

(65) Prior Publication Data

US 2011/0262859 A1 Oct. 27, 2011

(30) Foreign Application Priority Data

Mar. 23, 2010 (JP) ................... 2010-066335

(51) Int. Cl.
*G03F 7/00* (2006.01)
*G03F 7/004* (2006.01)
*G03F 7/11* (2006.01)

(52) U.S. Cl.
USPC ............. 430/273.1; 430/270.1; 430/271.1

(58) Field of Classification Search
USPC ................... 430/270.1, 271.1, 273.1
See application file for complete search history.

(56) References Cited

U.S. PATENT DOCUMENTS

| | | | |
|---|---|---|---|
| 7,335,456 B2 * | 2/2008 | Li et al. ............... | 430/270.1 |
| 7,402,626 B2 | 7/2008 | Maeda et al. | |
| 7,670,750 B2 * | 3/2010 | Harada et al. ......... | 430/270.1 |
| 7,700,262 B2 * | 4/2010 | Li et al. ............... | 430/273.1 |
| 7,998,655 B2 * | 8/2011 | Tsubaki ............... | 430/270.1 |
| 8,057,981 B2 * | 11/2011 | Harada et al. ......... | 430/270.1 |
| 8,071,272 B2 * | 12/2011 | Tsubaki ............... | 430/270.1 |
| 8,076,053 B2 * | 12/2011 | Nakamura et al. ...... | 430/270.1 |
| 8,088,557 B2 * | 1/2012 | Tsubaki ............... | 430/270.1 |
| 2005/0202347 A1 * | 9/2005 | Houlihan et al. ........ | 430/311 |
| 2006/0036005 A1 | 2/2006 | Kanda et al. | |
| 2007/0122741 A1 | 5/2007 | Hatakeyama et al. | |
| 2007/0160930 A1 | 7/2007 | Wang et al. | |
| 2007/0254235 A1 * | 11/2007 | Allen et al. ........... | 430/270.1 |
| 2009/0136878 A1 * | 5/2009 | Kanna ................. | 430/325 |
| 2009/0208867 A1 | 8/2009 | Harada et al. | |
| 2010/0255416 A1 | 10/2010 | Kouno et al. | |

FOREIGN PATENT DOCUMENTS

| | | |
|---|---|---|
| JP | 6-012452 | 1/1994 |
| JP | 2004-346243 | 12/2004 |
| JP | 2005-316352 | 11/2005 |
| JP | 2006-53300 | 2/2006 |
| JP | 2007-219504 | 8/2007 |
| JP | 2007-316581 | 12/2007 |
| JP | 2007-326903 | 12/2007 |
| JP | 2008139789 A * | 6/2008 |
| JP | 2009-122325 | 6/2009 |
| JP | 2009-145395 | 7/2009 |
| JP | 2009-192784 | 8/2009 |
| WO | WO 2007/049637 | 5/2007 |
| WO | WO 2009/041270 | 4/2009 |

OTHER PUBLICATIONS

Japanese Office Action for corresponding JP Application No. 2012-507037, Jul. 24, 2012.
International Search Report with Written Opinion of the International Searching Authority for corresponding International Application No. PCT/JP2011/057012, Apr. 19, 2011.

* cited by examiner

*Primary Examiner* — Amanda C. Walke
(74) *Attorney, Agent, or Firm* — Ditthavong Mori & Steiner, P.C.

(57) ABSTRACT

An upper-layer film-forming composition includes (A) a resin that is soluble in an alkaline aqueous solution, and includes a fluorine atom, and (B) a solvent component that includes (B1) a solvent having a boiling point at 101.3 kPa of 150° C. or more and a static surface tension of 23.0 mN/m or less, the upper-layer film-forming composition being used to form an upper-layer film on a photoresist film.

8 Claims, No Drawings

UPPER LAYER-FORMING COMPOSITION AND RESIST PATTERNING METHOD

TECHNICAL FIELD

The invention relates to an upper-layer film-forming composition that is used to form an upper-layer film on a photoresist film, and a resist pattern-forming method using the upper-layer film-forming composition.

BACKGROUND ART

In the field of microfabrication such as production of integrated circuit devices, photolithographic technology that enables a reduction in line width has been desired in order to achieve a higher degree of integration. However, it is considered that it may be very difficult to implement sub-quarter-micrometer microfabrication using near ultraviolet rays such as an i-line. Therefore, use of radiation having a shorter wavelength has been studied in order to enable microfabrication with a line width of 0.10 μm or less, for example Examples of such short-wavelength radiation include a bright line spectrum of a mercury lamp, deep ultraviolet rays (e.g., excimer laser light), X-rays, and electron beams. In particular, KrF excimer laser light (wavelength: 248 nm) and ArF excimer laser light (wavelength: 193 nm) have attracted attention. Various photoresist film-forming radiation-sensitive resin compositions suitable for use with such short-wavelength radiation have been proposed.

Liquid immersion lithography that exposes a photoresist film via an immersion medium (e.g., water) having a refractive index higher than that of air has been proposed in order to form a finer pattern. When using liquid immersion lithography, a photoresist film formed on a wafer and a lens of an exposure system come into contact with an immersion medium (e.g., water). Therefore, the immersion medium may permeate the photoresist film, and may reduce the resolution of the photoresist. Moreover, the component of the photoresist film may be eluted into the immersion medium, and may contaminate the surface of the lens of the exposure system. In order to solve the above problems, a method that forms an upper-layer film (i.e., protective film) on the photoresist film in order to isolate the photoresist film from the immersion medium, and an upper-layer film-forming composition used for the above method have been proposed (see Patent Document 1, for example).

RELATED-ART DOCUMENT

Patent Document
Patent Document 1: Japanese Patent Application Publication (KOKAI) No. 2005-316352

DISCLOSURE OF THE INVENTION

However, the above upper-layer film-forming composition may be dried within a nozzle until the upper-layer film-forming composition is applied to a photoresist film formed on a substrate that is subsequently processed in the semiconductor production process. A high-boiling-point solvent may be used as a solvent for the upper-layer film-forming composition in order to prevent a situation in which the upper-layer film-forming composition is dried. However, such a high-boiling-point solvent may cause coating defects, so that a normal resist pattern may not be formed. Coating defects may be prevented by continuously causing the upper-layer film-forming composition to flow through the nozzle, or performing the subsequent coating operation after disposing of (dummy dispensing) the dried upper-layer film-forming composition. However, these methods waste the material.

The invention was conceived in view of the above problems. An object of the invention is to provide an upper-layer film-forming composition that is rarely dried between coating operations, and can suppress occurrence of coating defects, and a resist pattern-forming method using the upper-layer film-forming composition.

The inventors of the invention conducted extensive studies in order to achieve the above object. As a result, the inventors found that the above object can be achieved by an upper-layer film-forming composition that includes a specific amount of a solvent having a boiling point at 101.3 kPa of 150° C. or more and a static surface tension of 23.0 mN/m or less. This finding has led to the completion of the invention.

Specifically, the invention provides the following upper-layer film-forming composition and resist pattern-forming method.

[1] An upper-layer film-forming composition including (A) a resin that is soluble in an alkaline aqueous solution, and includes a fluorine atom (hereinafter may be referred to as "resin (A)"), and (B) a solvent component that includes (B1) a solvent having a boiling point at 101.3 kPa of 150° C. or more and a static surface tension of 23.0 mN/m or less (hereinafter may be referred to as "solvent (B1)"), the upper-layer film-forming composition being used to form an upper-layer film on a photoresist film.

[2] The upper-layer film-forming composition according to [1], wherein the solvent (B1) has a boiling point at 101.3 kPa of 150 to 180° C. and a static surface tension of 21.0 to 23.0 mN/m.

[3] The upper-layer film-forming composition according to [1] or [2], wherein the content of the solvent (B1) in the solvent component (B) is 1 to 15 mass %.

[4] The upper-layer film-forming composition according to any one of [1] to [3], wherein the solvent component (B) further includes (B2) a solvent shown by the following general formula (B2), $$R^1\text{---}OH \tag{B2}$$

wherein $R^1$ represents a linear, branched, or cyclic hydrocarbon group having 1 to 10 carbon atoms or a halogenated hydrocarbon group.

[5] The upper-layer film-forming composition according to any one of [1] to [4], wherein the solvent component (B) further includes (B3) a solvent shown by the following general formula (B3), $$R^2\text{---}O\text{---}R^3 \tag{B3}$$

wherein $R^2$ and $R^3$ individually represent a hydrocarbon group having 1 to 8 carbon atoms or a halogenated hydrocarbon group.

[6] The upper-layer film-forming composition according to any one of [1] to [5], wherein the solvent (B1) is shown by the following general formula (B1-1),

(B1-1)

wherein n is an integer from 1 to 4, $R^4$ and $R^5$ individually represent a hydrogen atom, an alkyl group having 1 to 4 carbon atoms, or an acyl group, and $R^6$ represents a hydrogen atom or a methyl group.

[7] The upper-layer film-forming composition according to any one of [1] to [6], wherein the solvent (B1) is dipropylene glycol dimethyl ether or ethylene glycol monoisobutyl ether.

[8] The upper-layer film-forming composition according to any one of [1] to [7], wherein the resin (A) includes at least one repeating unit selected from the group consisting of a repeating unit that includes a group shown by the following general formula (a1) (hereinafter may be referred to as "repeating unit (a1)"), a repeating unit that includes a group shown by the following general formula (a2) (hereinafter may be referred to as "repeating unit (a2)"), a repeating unit that includes a group shown by the following general formula (a3) (hereinafter may be referred to as "repeating unit (a3)"), a repeating unit that includes a carboxyl group (hereinafter may be referred to as "repeating unit (a4)"), and a repeating unit that includes a sulfo group (hereinafter may be referred to as "repeating unit (a5)"), and has a polystyrene-reduced mass average molecular weight (hereinafter may be referred to as "Mw)") determined by gel permeation chromatography (hereinafter may be referred to as "GPC)") of 2000 to 100,000,

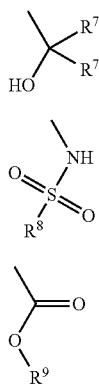

wherein $R^7$ individually represent a hydrogen atom, a fluorine atom, an alkyl group having 1 to 4 carbon atoms, or a fluoroalkyl group having 1 to 4 carbon atoms, provided that at least one of $R^7$ represents a fluoroalkyl group having 1 to 4 carbon atoms, $R^8$ represents a fluoroalkyl group having 1 to 20 carbon atoms, and $R^9$ represents a fluorohydrocarbon group or an organic group that includes a polar group.

[9] The upper-layer film-forming composition according to any one of [1] to [8], further including at least one of an acid and a photoacid generator (hereinafter may be referred to as "acid component (C))").

[10] A resist pattern-forming method including (1) applying a photoresist composition to a substrate to form a photoresist film, (2) applying the upper-layer film-forming composition according to any one of [1] to [9] to the photoresist film to form an upper-layer film on the photoresist film, (3) exposing the upper-layer film and the photoresist film by applying radiation to the upper-layer film and the photoresist film via an immersion medium disposed on the upper-layer film and a mask having a given pattern, and (4) developing the upper-layer film and the photoresist film that have been exposed using a developer to form a resist pattern.

The above upper-layer film-forming composition is rarely dried between coating operations during semiconductor production process, and can suppress occurrence of coating defects.

The above resist pattern-forming method ensures that the upper-layer film-forming composition is rarely dried between coating operations during semiconductor production process, and can suppress occurrence of coating defects.

DESCRIPTION OF EXEMPLARY EMBODIMENTS

Exemplary embodiments of the invention are described below. Note that the invention is not limited to the following exemplary embodiments. Various modifications and improvements may be made of the following exemplary embodiments without departing from the scope of the invention based on the knowledge of a person having ordinary skill in the art.

1. Upper-Layer Film-forming Composition

An upper-layer film-forming composition according to one embodiment of the invention includes (A) a resin and (B) a solvent component, and is used to form an upper-layer film on a photoresist film. The upper-layer film-forming composition may optionally include an acid and a photoacid generator. The details of the upper-layer film-forming composition are described below.

1-1. Resin (A)

The resin (A) can form a film that is stable to an immersion medium (e.g., water) during liquid immersion lithography, and is soluble in a developer (alkaline aqueous solution) used in a development step (step (4)) of a resist pattern-forming method described later.

The expression "stable to an immersion medium" used herein means that a film that is formed on a substrate and has a thickness of 10 to 100 nm has a thickness within ±3% of the initial thickness after being subjected to the following step. Specifically, when using water as the immersion medium, ultrapure water is discharged for 60 seconds from a rinse nozzle of a semiconductor production system ("CLEAN TRACK ACT8" manufactured by Tokyo Electron Ltd.), and the film is spin-dried at 4000 rpm for 15 seconds. The thickness of the film is measured using a thickness meter ("Lambda Ace VM-90" manufactured by Dainippon Screen Mfg. Co., Ltd.).

The expression "soluble in a developer" used herein means that the resin included in an upper-layer film formed on a photoresist film is completely dissolved (removed) in a developer when developed using the developer.

It is preferable that the resin (A) include at least one repeating unit selected from the group consisting of repeating units (a1), (a2), (a3), (a4), and (a5), and have a polystyrene-reduced mass average molecular weight (Mw)) determined by GPC of 2000 to 100,000. It is more preferable that the resin (A) include at least one of the repeating units (a1) and (a2).

1-1-1. Repeating Unit (a1)

The repeating unit (a1) includes an alcoholic hydroxyl group and at least one fluoroalkyl group at the α-position (see the following general formula (a1)). The alcoholic hydroxyl group has weak acidity in an aqueous solution since the hydrogen atom easily dissociates due to the electron-attracting properties of the fluoroalkyl group. Therefore, the resin (A) is insoluble in an immersion medium, but is easily soluble in a developer.

wherein R⁷ individually represent a hydrogen atom, a fluorine atom, an alkyl group having 1 to 4 carbon atoms, or a fluoroalkyl group having 1 to 4 carbon atoms, provided that at least one of R⁷ represents a fluoroalkyl group having 1 to 4 carbon atoms.

Specific examples of the alkyl group having 1 to 4 carbon atoms represented by R⁷ in the general formula (a1) include a methyl group, an ethyl group, an n-propyl group, an n-butyl group, and the like.

Specific examples of the fluoroalkyl group having 1 to 4 carbon atoms represented by R⁷ in the general formula (a1) include a difluoromethyl group, a perfluoromethyl group, a 2,2-difluoroethyl group, a 2,2,2-trifluoroethyl group, a perfluoroethyl group, a 2,2,3,3,-tetrafluoropropyl group, a perfluoroethylmethyl group, a perfluoropropyl group, a 2,2,3,3,4,4-hexafluorobutyl group, a perfluorobutyl group, and the like.

Among these, a perfluoromethyl group is preferable from the viewpoint of an improvement in solubility of the resin (A) in a developer.

A repeating unit shown by the following general formula (a1-1) is preferable as the repeating unit (a1).

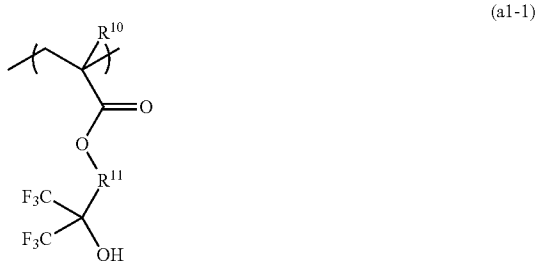

(a1-1)

wherein R¹⁰ represents a hydrogen atom or a methyl group, and R¹¹ represents a divalent organic group.

The divalent organic group represented by R¹¹ in the general formula (a1-1) is preferably a divalent hydrocarbon group. Specific examples of the divalent hydrocarbon group include chain-like hydrocarbon groups such as a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a 1-propylidene group, and a 2-propylidene group; cycloalkylene group having 3 to 10 carbon atoms, such as a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); bridged dicyclic to tetracyclic hydrocarbon groups having 4 to 30 carbon atoms, such as a norbornylene group (e.g., 1,4-norbornylene group and 2,5-norbornylene group), and an adamantylene group (e.g., 1,5-adamantylene group and 2,6-adamantylene group); and the like.

When R¹¹ represents an alicyclic hydrocarbon group (e.g., cycloalkylene group or bridged cyclic hydrocarbon group), it is preferable that a methylene group or an alkylene group having 2 to 4 carbon atoms (i.e., spacer) be inserted between the alicyclic hydrocarbon group and the bis(trifluoromethyl) hydroxymethyl group.

The divalent organic group represented by R¹¹ in the general formula (a1-1) is particularly preferably a 2,5-norbornylene group, a 2,6-norbornylene group, or a 1,2-propylene group.

The resin (A) may include only one type of repeating unit (a1), or may include two or more types of repeating units (a1).

1-1-2. Repeating Unit (a2)

The repeating unit (a2) includes a group shown by the following general formula (a2).

(a2)

wherein R⁸ represents a fluoroalkyl group having 1 to 20 carbon atoms.

Specific examples of the fluoroalkyl group having 1 to 20 carbon atoms represented by R⁸ in the general formula (a2) include a difluoromethyl group, a perfluoromethyl group, a 2,2-difluoroethyl group, a 2,2,2-trifluoroethyl group, a perfluoroethyl group, a 2,2,3,3,-tetrafluoropropyl group, a perfluoroethylmethyl group, a perfluoropropyl group, a 2,2,3,3,4,4-hexafluorobutyl group, a perfluorobutyl group, a 1,1-dimethyl-2,2,3,3-tetrafluoropropyl group, a 1,1-dimethyl-2,2,3,3,3-pentafluoropropyl group, a 2-(perfluoropropyl)ethyl group, a 2,2,3,3,4,4,5,5-octafluoropentyl group, a perfluoropentyl group, a 1,1-dimethyl-2,2,3,3,4,4-hexafluorobutyl group, a 1,1-dimethyl-2,2,3,3,4,4,4-heptafluorobutyl group, a 2-(perfluorobutyl)ethyl group, a 2,2,3,3,4,4,5,5,6,6-decafluorohexyl group, a perfluoropentylmethyl group, a perfluorohexyl group, a 1,1-dimethyl-2,2,3,3,4,4,5,5-octafluoropentyl group, a 1,1-dimethyl-2,2,3,3,4,4,5,5,5-nonafluoropentyl group, a 2-(perfluoropentyl)ethyl group, a 2,2,3,3,4,4,5,5,6,6,7,7-dodecafluoroheptyl group, a perfluorohexylmethyl group, a perfluoroheptyl group, a 2-(perfluorohexyl)ethyl group, a 2,2,3,3,4,4,5,5,6,6,7,7,8,8-tetradecafluoro octyl group, a perfluoroheptylmethyl group, a perfluorooctyl group, a 2-(perfluoroheptyl)ethyl group, a 2,2,3,3,4,4,5,5,6,6,7,7,8,8,9,9-hexadecafluorononyl group, a perfluorooctylmethyl group, a perfluorononyl group, a 2-(perfluorooctyl)ethyl group, a 2,2,3,3,4,4,5,5,6,6,7,7,8,8,9,9,10,10-octadecafluorodecyl group, a perfluorononylmethyl group, a perfluorodecyl group, a 2,2,3,3,4,4,4-heptafluorobutyl group, and the like. Among these, a perfluoromethyl group, a perfluoroethyl group, a perfluoropropyl group, a perfluorobutyl group, and a perfluorooctyl group are particularly preferable.

A repeating unit shown by the following general formula (a2-1) is preferable as the repeating unit (a2).

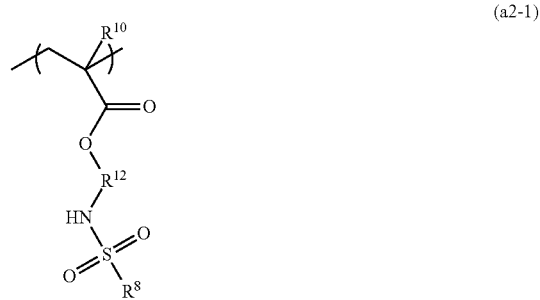

(a2-1)

wherein $R^8$ represents a fluoroalkyl group having 1 to 20 carbon atoms, $R^{10}$ represents a hydrogen atom or a methyl group, and $R^{12}$ represents a divalent organic group. Note that $R^8$ in the general formula (a2-1) has the same meaning as that of $R^8$ in the general formula (a2), and $R^{10}$ and $R^{12}$ in the general formula (a2-1) respectively have the same meaning as that of $R^{10}$ and $R^{11}$ in the general formula (a2).

When $R^{12}$ represents an alicyclic hydrocarbon group, it is preferable that a methylene group or an alkylene group having 2 to 4 carbon atoms (i.e., spacer) be inserted between the alicyclic hydrocarbon group and the amino group (—NH—).

The divalent organic group represented by $R^{12}$ in the general formula (a2-1) is particularly preferably a 2,5-norbornylene group, a 1,5-adamantylene group, an ethylene group, or a 1,3-propylene group.

The resin (A) may include only one type of repeating unit (a2), or may include two or more types of repeating units (a2).

1-1-3. Repeating Unit (a3)

The repeating unit (a3) includes a group shown by the following general formula (a3).

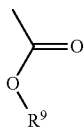

(a3)

wherein $R^9$ represents a fluorohydrocarbon group or an organic group that includes a polar group.

Examples of the fluorohydrocarbon group represented by $R^9$ in the general formula (a3) include monovalent fluorohydrocarbon groups having 1 to 20 carbon atoms.

Examples of the organic group that includes a polar group represented by $R^9$ in the general formula (a3) include monovalent hydrocarbon groups having 1 to 20 carbon atoms (excluding the group shown by the general formula (a1)) that may be fluorinated and include a polar group such as a hydroxyl group, an amino group, or a cyano group.

Specific examples of the group represented by $R^9$ in the general formula (a3) include a hydroxymethyl group, a 1-hydroxyethyl group, a 2-hydroxyethyl group, a 1-hydroxypropyl group, a 2-hydroxypropyl group, a 3-hydroxypropyl group, a 2-hydroxybutyl group, a 2,3-dihydroxypropyl group, a 1,2,3-trihydroxypropyl group, a polypropylene glycol group, a 2-hydroxycyclohexyl group, a 4-hydroxycyclohexyl group, a 3-hydroxy-1-adamantyl group, a 3,5-dihydroxy-1-adamantyl group, an aminomethyl group, a 1-aminoethyl group, a 2-aminoethyl group, a 1-aminopropyl group, a 2-aminopropyl group, a 3-aminopropyl group, a difluoromethyl group, a perfluoromethyl group, a 2,2-difluoroethyl group, a 2,2,2-trifluoroethyl group, a perfluoroethyl group, a 1-(perfluoromethyl)ethyl group, a 2-(perfluoromethyl)ethyl group, a 2,2,3,3-tetrafluoropropyl group, a perfluoroethylmethyl group, a di(perfluoromethyl)methyl group, a 1,1,1,3,3,3-hexafluoro-2-propyl group, a perfluoropropyl group, a 1-methyl-2,2,3,3-tetrafluoropropyl group, a 1-(perfluoroethyl)ethyl group, a 2-(perfluoroethyl)ethyl group, a 2,2,3,3,4,4-hexafluorobutyl group, a perfluoropropylmethyl group, a perfluorobutyl group, a perfluoropentyl group, a perfluorohexyl group, a perfluoroheptyl group, a perfluorooctyl group, a perfluorononyl group, a perfluorodecyl group, and the like.

A repeating unit shown by the following general formula (a3-1) is preferable as the repeating unit (a3).

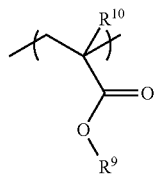

(a3-1)

wherein $R^9$ represents a fluorinated hydrocarbon group or an organic group that includes a polar group, and $R^{10}$ represents a hydrogen atom or a methyl group. Note that $R^9$ in the general formula (a3-1) has the same meaning as that of $R^9$ in the general formula (a3), and $R^{10}$ in the general formula (a3-1) has the same meaning as that of $R^{10}$ in the general formula (a1-1).

The repeating unit (a3) may be a repeating unit derived from a cyano group-containing polymerizable monomer (e.g., acrylonitrile or methacrylonitrile) or an amide group-containing polymerizable monomer (e.g., acrylamide or methacrylamide).

The resin (A) may include only one type of repeating unit (a3), or may include two or more types of repeating units (a3).

1-1-4. Repeating Unit (a4)

Examples of a polymerizable monomer that produces the repeating unit (a4) include carboxyl group-containing polymerizable monomers.

Specific examples of the carboxyl group-containing polymerizable monomers include unsaturated monocarboxylic acids such as (meth)acrylic acid, crotonic acid, cinnamic acid, atropic acid, 3-acetyloxy(meth)acrylate, 3-benzoyloxy(meth)acrylate, α-methoxyacrylate, 3-cyclohexyl(meth)acrylate; unsaturated polycarboxylic acids such as fumaric acid, maleic acid, citraconic acid, mesaconic acid, itaconic acid; monoalkyl esters such as monomethyl esters, monoethyl esters, mono-n-propyl esters, and mono-n-butyl esters of these unsaturated polycarboxylic acids; 2-(meth)acrylamido-2-methylpropanecarboxylic acid, 2-α-carboxyacrylamido-2-methylpropanecarboxylic acid, 2-α-carboxymethylacrylamido-2-methylpropanecarboxylic acid, 2-α-methoxycarbonylacrylamido-2-methylpropanecarboxylic acid, 2-α-acetyloxyacrylamido-2-methylpropanecarboxylic acid, 2-α-phenylacrylamido-2-methylpropanecarboxylic acid, 2-α-benzylacrylamido-2-methylpropanecarboxylic acid, 2-α-methoxyacrylamido-2-methylpropanecarboxylic acid, 2-α-cyclohexylacrylamido-2-methylpropanecarboxylic acid, 2-α-cyanoacrylamido-2-methylpropanecarboxylic acid, and the like.

The carboxyl group-containing polymerizable monomer that produces the repeating unit (a4) is preferably a polymerizable monomer shown by the following general formula (a4-M1).

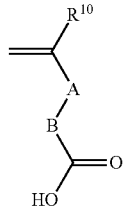

(a4-M1)

wherein $R^{10}$ represents a hydrogen atom or a methyl group, A represents a single bond, a carbonyl group, a carbonyloxy group, or an oxycarbonyl group, and B represents a single bond or a divalent organic group having 1 to 20 carbon atoms. Note that $R^{10}$ in the general formula (a4-M1) has the same meaning as that of $R^{10}$ in the general formula (a1-1).

Examples of the divalent organic group having 1 to 20 carbon atoms represented by B in the general formula (a4-M1) include the groups mentioned above in connection with the divalent organic group represented by $R^{11}$ in the general formula (a1-1), and arylene groups (e.g., phenylene group and tolylene group).

The repeating unit (a4) is preferably a repeating unit derived from (meth)acrylic acid, crotonic acid, or 2-methacryloyloxyethyl hexahydrophthalate.

The resin (A) may include only one type of repeating unit (a4), or may include two or more types of repeating units (a4).

1-1-5. Repeating Unit (a5)

Examples of a polymerizable monomer that produces the repeating unit (a5) include a sulfo group-containing polymerizable monomer shown by the following general formula (a5-M1).

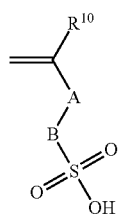

(a5-M1)

wherein $R^{10}$ represents a hydrogen atom or a methyl group, A represents a single bond, a carbonyl group, a carbonyloxy group, or an oxycarbonyl group, and B represents a single bond or a divalent organic group having 1 to 20 carbon atoms. Note that $R^{10}$ in the general formula (a5-M1) has the same meaning as that of $R^{10}$ in the general formula (a1-1), and A and B in the general formula (a5-M1) respectively have the same meaning as that of A and B in the general formula (a4-M1).

Examples of a preferable polymerizable monomer shown by the general formula (a5-M1) include vinylsulfonic acid, allylsulfonic acid, 2-(meth)acrylamide-2-methyl-1-propanesulfonic acid, and 4-vinyl-1-benzenesulfonic acid. Among these, vinylsulfonic acid and allylsulfonic acid are particularly preferable.

The resin (A) may include only one type of repeating unit (a5), or may include two or more types of repeating units (a5).

1-1-6. Additional Repeating Unit

The resin (A) may include an additional repeating unit (e.g., a repeating unit that includes an acid-dissociable group) other than the repeating units (a1) to (a5) (hereinafter may be referred to as "repeating unit (a6)") in order to control the molecular weight, the glass transition temperature, the solubility in the solvent component (B), and the like.

Specific examples of a polymerizable monomer that produces the repeating unit (a6) include alkyl(meth)acrylates such as methyl(meth)acrylate, ethyl(meth)acrylate, n-butyl (meth)acrylate, sec-butyl(meth)acrylate, tert-butyl(meth) acrylate, isopropyl (meth)acrylate, n-hexyl(meth)acrylate, cyclohexyl(meth)acrylate, 2-methylcyclohexyl (meth)acrylate, dicyclopentanyloxyethyl(meth)acrylate, isoboronyl (meth)acrylate, dicyclopentanyl (metha)acrylate, methoxy dipropylene glycol(meth)acrylate, butoxy dipropylene glycol (meth)acrylate, methoxy diethylene glycol(meth)acrylate, methoxy propylene glycol(meth)acrylate, 2-methyl-2-adamantyl(meth)acrylate, 2-ethyl-2-adamantyl (meth)acrylate, 2-propyl-2-adamantyl(meth)acrylate, 2-butyl-2-adamantyl(meth)acrylate, 1-methyl-1-cyclohexyl (meth)acrylate, 1-ethyl-1-cyclohexyl(meth)acrylate, 1-propyl-1-cyclohexyl(meth)acrylate, 1-butyl-1-cyclohexyl (meth)acrylate, 1-methyl-1-cyclopentyl(meth)acrylate, 1-ethyl-1-cyclopentyl(meth)acrylate, 1-propyl-1-cyclopentyl(meth)acrylate, 1-butyl-1-cyclopentyl(meth)acrylate, 1-adamantyl-1-methylethyl(meth)acrylate, and 1-bicyclo [2.2.1]heptyl-1-methylethyl (meth)acrylate;

unsaturated dicarboxylic diesters such as diethyl maleate, diethyl fumarate, and diethyl itaconate; aryl(meth)acrylates such as phenyl(meth)acrylate and benzyl(meth)acrylate; aromatic vinyls such as styrene, α-methylstyrene, m-methylstyrene, p-methylstyrene, vinyltoluene, and p-methoxystyrene; fatty acid vinyl esters such as vinyl acetate; chlorine atom-containing polymerizable monomers such as vinyl chloride and vinylidene chloride; and conjugated diolefins such as 1,3-butadiene, isoprene, and 1,4-dimethylbutadiene. Among these, alkyl(meth)acrylates are preferable. These polymerizable monomers may be used either individually or in combination.

1-1-7. Content of Each Repeating Unit

The content of the repeating unit (a1) or (a2) in the resin (A) is preferably 10 mol % or more, more preferably 20 mol % or more, and particularly preferably 30 mol % or more, based on the total content (=100 mol %) of the repeating units. If the content of the repeating unit (a1) is within the above range, the resin (A) is easily dissolved in a developer (alkaline aqueous solution), so that a situation in which the upper-layer film remains on the resist pattern can be suppressed. The resin (A) may include the repeating units (a1) and (a2).

The content of the repeating unit (a3), (a4), or (a5) in the resin (A) is preferably 0 to 50 mol %, more preferably 0 to 40 mol %, and particularly preferably 0 to 20 mol %, based on the total content (=100 mol %) of the repeating units. If the content of the repeating unit (a3), (a4), or (a5) is within the above range, the resin (A) exhibits water repellency and solubility in a developer in a well-balanced manner when used to form an upper-layer film.

The content of the repeating unit (a6) in the resin (A) is preferably 0 to 50 mol %, and more preferably 0 to 40 mol %, based on the total content (=100 mol %) of the repeating units.

The upper-layer film-forming composition according to one embodiment of the invention may include only one type of resin (A), or may include two or more types of resins (A).

1-1-8. Synthesis of Resin (A)

The resin (A) may be synthesized by a known polymerization method. For example, the resin (A) may be synthesized in a polymerization solvent by radical polymerization using a radical initiator.

Examples of the polymerization solvent include alcohols, cyclic ethers, alkyl ethers of polyhydric alcohols, alkyl ether acetates of polyhydric alcohols, aromatic hydrocarbons, ketones, and esters. Among these, cyclic ethers, alkyl ethers of polyhydric alcohols, alkyl ether acetates of polyhydric alcohols, ketones, and esters are preferable.

Specific examples of the radical initiator include azo compounds such as 2,2'-azobisisobutyronitrile, 2,2'-azobis-(2-methylmethylpropionate), 2,2'-azobis-(2,4-dimethylvaleronitrile), 2,2'-azobis-(4-methoxy-2-dimethylvaleronitrile); organic peroxides such as benzoyl peroxide, lauroyl peroxide, tert-butyl peroxypivalate, 1,1'-bis-(tert-butylperoxy)cyclohexane; hydrogen peroxide, and the like. When using a peroxide as the radical initiator, a reducing agent may be used in combination with the peroxide (i.e., redox-type radical initiator).

The polymerization conditions may be appropriately selected depending on the polymerization method, the type of radical initiator, the type of polymerization solvent, and the like. The polymerization temperature is normally 30 to 180° C., and preferably 60 to 150° C., and the polymerization time is normally 30 minutes to 8 hours, and preferably 1 to 6 hours.

The resin obtained by polymerization is preferably purified by re-precipitation. Specifically, the polymer solution is poured into a re-precipitation solvent after completion of polymerization to collect (purify) the target resin as a powder. The above polymerization solvents may be used either individually or in combination as the re-precipitation solvent.

1-1-9. Properties of Resin (A)

The Mw of the resin (A) determined by GPC is not particularly limited, but is preferably 2000 to 100,000, more preferably 2500 to 50,000, and particularly preferably 3000 to 20,000. If the Mw of the resin (A) is within the above range, the resulting upper-layer film exhibits sufficient water resistance and mechanical properties, and the resin (A) exhibits sufficient solubility in the solvent component (B).

The ratio (Mw/Mn) of the Mw to the polystyrene-reduced number average molecular weight (Mn) of the resin (A) determined by GPC is normally 1.0 to 5.0, and preferably 1.0 to 3.0.

1-1-10. Additional Resin

The upper-layer film-forming composition according to one embodiment of the invention may further include an additional resin other than the resin (A). Examples of the additional resin include a water-repellent resin ($\alpha$) and a hydrophilic resin ($\beta$). When the upper-layer film-forming composition according to one embodiment of the invention includes the water-repellent resin ($\alpha$) in addition to the resin (A), the receding contact angle of the upper-layer film can be increased. When the upper-layer film has a high receding contact angle, droplets of the immersion medium rarely remain on the upper-layer film during liquid immersion lithography even when performing a high-speed scan, for example. Moreover, when the upper-layer film-forming composition includes the water-repellent resin ($\alpha$) in addition to the resin (A), the dissolution rate of the upper-layer film in the developer can be increased. Such an upper-layer film rarely produces development defects.

Examples of the water-repellent resin ($\alpha$) include a resin that includes a repeating unit shown by the general formula (a3) in which $R^9$ represents a fluorohydrocarbon group (hereinafter may be referred to as "repeating unit (a3-a)"). The water-repellent resin ($\alpha$) may include the repeating unit (a1), the repeating unit (a2), a repeating unit shown by the general formula (a3) in which $R^9$ represents the organic group that includes a polar group (hereinafter may be referred to as "repeating unit (a3-b)"), the repeating unit (a4), or the repeating unit (a5).

The content of the repeating unit (a3-a) in the water-repellent resin ($\alpha$) is 30 to 80 mol %, and preferably 40 to 70 mol %, based on the total content (=100 mol %) of the repeating units. If the content of the repeating unit (a3-a) is within the above range, an upper-layer film having a high receding contact angle can be obtained.

The content of the repeating unit (a1) or (a2) in the water-repellent resin ($\alpha$) may be 20 to 70 mol % based on the total content (=100 mol %) of the repeating units. The content of the repeating unit (a3-b), (a4), or (a5) in the water-repellent resin ($\alpha$) is 0 to 10 mol %, and preferably 0 to 5 mol %, based on the total content (=100 mol %) of the repeating units.

The upper-layer film-forming composition according to one embodiment of the invention may include only one type of water-repellent resin ($\alpha$), or may include two or more types of water-repellent resins ($\alpha$).

Examples of the hydrophilic resin ($\beta$) include a resin that includes 10 to 95 mol % of the repeating unit (a4), 1 to 10 mol % of the repeating unit (a5), and 0 to 50 mol % of the repeating unit (a1) or (a2) based on the total content (=100 mol %) of the repeating units. Note that the hydrophilic resin ($\beta$) may include 0 to 30 mol % (preferably 0 to 10 mol %) of the repeating unit (a3-a), and 0 to 95 mol % of the repeating unit (a1).

The upper-layer film-forming composition according to one embodiment of the invention may include only one type of hydrophilic resin ($\beta$), or may include two or more types of hydrophilic resins ($\beta$).

1-2. Solvent Component (B)

The solvent component (B) includes (B1) a solvent that dissolves the resin (A), and has a boiling point at 101.3 kPa of 150° C. or more and a static surface tension of 23.0 mN/m or less. It is preferable that the solvent component (B) further include at least one of solvents (B2) and (B3) described later.

The content of the solvent component (B) in the upper-layer film-forming composition according to one embodiment of the invention may be appropriately adjusted depending on the thickness of the desired upper-layer film, but is normally 1000 to 10,000 parts by mass based on 100 parts by mass of the resin (A).

1-2-1. Solvent (B1)

The solvent (B1) has a boiling point at 101.3 kPa of 150° C. or more and a static surface tension of 23.0 mN/m or less. When the upper-layer film-forming composition includes the solvent (B1), the upper-layer film-forming composition is rarely dried within a nozzle until the upper-layer film-forming composition is applied to a photoresist film formed on a substrate that is subsequently processed in the semiconductor production process.

The solvent (B1) has a boiling point at 101.3 kPa of 150° C. or more, preferably 150 to 180° C., more preferably 155 to 180° C., and particularly preferably 160 to 180° C. If the boiling point of the solvent (B1) is within the above range, a uniform upper-layer film can be formed without causing coating defects. Moreover, it is possible to suppress a situation in which the upper-layer film-forming composition is dried within a nozzle.

The solvent (B1) has a static surface tension of 23.0 mN/m or less, preferably 21.0 to 23.0 mN/m, more preferably 21.0 to 22.5 mN/m, and particularly preferably 21.0 to 22.0 mN/m. If the static surface tension of the solvent (B1) is within the above range, the solvent (B1) exhibits good mutual solubility with the resin (A), so that occurrence of coating defects can be suppressed. Note that the term "static surface tension" used herein refers to a value measured at 23° C. by the Wilhelmy method.

Since the solvent (B1) can advantageously dissolve the resin (A), and has low viscosity, the amount of the upper-layer film-forming composition applied to the resist film can be reduced.

The solvent (B1) is preferably a solvent shown by the following general formula (B1-1).

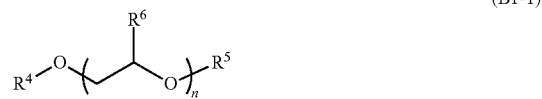

(B1-1)

wherein n is an integer from 1 to 4, $R^4$ and $R^5$ individually represent a hydrogen atom, an alkyl group having 1 to 4 carbon atoms, or an acyl group, and $R^6$ represents a hydrogen atom or a methyl group.

Examples of the alkyl group having 1 to 4 carbon atoms represented by $R^4$ or $R^5$ in the general formula (B1-1) include a methyl group, an ethyl group, an n-propyl group, an i-propyl group, an n-butyl group, an s-butyl group, an i-butyl group, and a t-butyl group. Among these, a methyl group, an ethyl group, and an i-butyl group are preferable since the boiling point and the static surface tension of the solvent (B1) fall within a preferable range.

Examples of the acyl group represented by $R^4$ or $R^5$ in the general formula (B1-1) include an acetyl group, a propionyl group, a butanoyl group, and the like. Among these, an acetyl group is preferable since the boiling point and the static surface tension of the solvent (B1) fall within a preferable range.

The solvent (B1) is particularly preferably dipropylene glycol dimethyl ether or ethylene glycol monoisobutyl ether. These solvents may be used either individually or in combination as the solvent (B1).

The content of the solvent (B1) in the solvent component (B) is preferably 1 to 15 mass %, more preferably 3 to 12 mass %, and particularly preferably 5 to 10 mass %. If the content of the solvent (B1) is within the above range, it is possible to effectively prevent a situation in which the upper-layer film-forming composition is dried within a nozzle until the upper-layer film-forming composition is applied to a photoresist film formed on a substrate that is subsequently processed in the semiconductor production process.

1-2-2. Solvent (B2)

The solvent (B2) is a monohydric alcohol shown by the following general formula (B2).

$$R^1\text{—OH} \tag{B2}$$

wherein $R^1$ represents a linear, branched, or cyclic hydrocarbon group having 1 to 10 carbon atoms or a halogenated hydrocarbon group.

Specific examples of the solvent (B2) include methanol, ethanol, 1-propanol, isopropyl alcohol, 2-methyl-1-propanol, n-butyl alcohol, 2-butanol, tert-butyl alcohol, 1-pentanol, 2-pentanol, 3-pentanol, n-hexyl alcohol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 4-methyl-2-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, 3,7-dimethyl-3-octanol, and the like.

Among these, monohydric alcohols having 4 to 8 carbon atoms are preferable, and 2-methyl-1-propanol, 1-butanol, 2-butanol, 1-pentanol, 4-methyl-2-hexanol, 2-pentanol, 3-pentanol, 3-methyl-2-pentanol, 4-methyl-2-pentanol, 2-ethyl-1-butanol, and 2,4-dimethyl-3-pentanol are more preferable. These alcohols may be used either individually or in combination as the solvent (B2).

The content of the solvent (B2) in the solvent component (B) is preferably 10 to 75 mass %, more preferably 10 to 60 mass %, and particularly preferably 10 to 40 mass %. If the content of the solvent (B2) is within the above range, the solubility of the resin (A) in the upper-layer film-forming composition can be further improved without impairing the effect of the addition of the solvent (B1) to the upper-layer film-forming composition.

1-2-3. Solvent (B3)

The solvent (B3) is an ether shown by the following general formula (B3).

$$R^2\text{—O—}R^3 \tag{B3}$$

wherein $R^2$ and $R^3$ individually represent a hydrocarbon group having 1 to 8 carbon atoms or a halogenated hydrocarbon group.

Specific examples of the solvent (B3) include diethyl ether, dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, dihexyl ether, dioctyl ether, cyclopentyl methyl ether, cyclohexyl methyl ether, cyclododecyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, cyclohexyl-tert-butyl ether,
bromomethyl methyl ether, iodomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, di-2-bromoethyl ether, bis(2,2,2-trifluoroethyl)ether, chloromethyl octyl ether, bromomethyl octyl ether, di-2-chloroethyl ether, ethyl vinyl ether, butyl vinyl ether, aryl ethyl ether, aryl propyl ether, aryl butyl ether, diaryl ether, 2-methoxypropene, ethyl-1-propenyl ether, 1-methoxy-1,3-butadiene, cis-1-bromo-2-ethoxyethylene, 2-chloroethyl vinyl ether, allyl-1,1,2,2-tetrafluoroethyl ether, and the like.

Among these, dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, and cyclohexyl-tert-butyl ether are preferable. These ethers may be used either individually or in combination as the solvent (B3).

The content of the solvent (B3) in the solvent component (B) is preferably 20 to 80 mass %, more preferably 40 to 80 mass %, and particularly preferably 50 to 80 mass %. If the content of the solvent (B3) is within the above range, the amount of the upper-layer film-forming composition applied to the resist film can be further reduced without impairing the effect of the addition of the solvent (B1) to the upper-layer film-forming composition.

1-2-4. Solvent (B4)

The solvent component (B) may further include an additional solvent (hereinafter may be referred to as "solvent (B4)") in addition to the solvents (B1) to (B3). Specific examples of the additional solvent include cyclic ethers such as tetrahydrofuran and dioxane; aromatic hydrocarbons such as benzene, toluene, and xylene; ketones such as acetone, methyl ethyl ketone, methyl isobutyl ketone, cyclohexanone, 4-hydroxy-4-methyl-2-pentanone, and diacetone alcohol; and esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate. Among these, cyclic ethers, ketones, esters, and water are preferable. These solvents may be used either individually or in combination as the solvent (B4).

The content of the solvent (B4) in the solvent component (B) is preferably 75 mass % or less. If the content of the solvent (B4) is 75 mass % or less, the amount of the upper-layer film-forming composition applied to the resist film can be reduced. When using a solvent (e.g., tetrahydrofuran or methyl ethyl ketone) that erodes the photoresist film as the solvent (B4), the content of the solvent (B4) in the solvent component (B) is preferably 30 mass % or less, and more preferably 20 mass % or less. If the content of the solvent (B4) exceeds 30 mass %, the photoresist film may be eroded, and intermixing with the upper-layer film may occur. As a result, the resolution of the photoresist may significantly deteriorate.

1-3. Acid and Photoacid Generator (Acid Component (C))

When the upper-layer film-forming composition according to one embodiment of the invention includes at least one of an acid and a photoacid generator (acid component (C)), the lithographic performance of the resulting photoresist can be improved.

The content of the acid component (C) in the upper-layer film-forming composition according to one embodiment of the invention is preferably 10 parts by mass or less, more preferably 0.001 to 5 parts by mass, and particularly preferably 0.005 to 3 parts by mass, based on 100 parts by mass of the resin (A). If the content of the acid component (C) exceeds 10 parts by mass, the acid component (C) may be eluted into the immersion medium during liquid immersion lithography, and may contaminate the lens of the exposure system.

1-3-1. Acid

Examples of the acid include carboxylic acids and sulfonic acids. Specific examples of such acids include the compounds disclosed at paragraphs [0045] and [0046] of WO2007/049637. These acid components may be used either individually or in combination.

1-3-2. Photoacid Generator

The photoacid generator generates an acid upon exposure. Examples of the photoacid generator include sulfonimide compounds, disulfonylmethane compounds, onium salt compounds, sulfone compounds, sulfonate compounds, diazomethane compounds, and the like. Specific examples of these compounds include the compounds disclosed at paragraphs [0037] to [0044] of WO2007/049637. These photoacid generators may be used either individually or in combination.

1-4. Additive

The upper-layer film-forming composition according to one embodiment of the invention may include an additive (e.g., surfactant and acid diffusion controller) in addition to the resin (A), the solvent component (B), and the acid component (C).

1-4-1. Surfactant

When the upper-layer film-forming composition according to one embodiment of the invention includes a surfactant, the applicability, defoamability, leveling properties, and the like of the upper-layer film-forming composition are improved. Examples of the surfactant include fluorine-containing surfactants such as BM-1000, BM-1100 (manufactured by BM Chemie), Megafac F142D, Megafac F172, Megafac F173, Megafac F183 (manufactured by DIC Corporation), Fluorad FC-135, Fluorad FC-170C, Fluorad FC-430, Fluorad FC-431 (manufactured by Sumitomo 3M, Ltd.), Surflon S-112, Surflon S-113, Surflon S-131, Surflon S-141, Surflon S-145 (manufactured by Asahi Glass Co., Ltd.), SH-28PA, SH-190, SH-193, SZ-6032, SF-8428 (manufactured by Dow Corning Toray Silicone Co., Ltd.), FTX-218G, FTX-230G, FTX-240G, FTX-209F, FTX-213F (manufactured by NEOS Co., Ltd.), and the like. These surfactants may be used either individually or in combination.

The content of the surfactant in the upper-layer film-forming composition according to one embodiment of the invention is preferably 5 parts by mass or less based on 100 parts by mass of the resin (A).

1-4-2. Acid Diffusion Controller

When the upper-layer film-forming composition according to one embodiment of the invention includes an acid diffusion controller, the lithographic performance of the resulting photoresist is improved, for example. Specific examples of the acid diffusion controller include the compounds disclosed at paragraphs [0048] to [0053] of WO2007/049637. These acid diffusion controllers may be used either individually or in combination.

The content of the acid diffusion controller in the upper-layer film-forming composition according to one embodiment of the invention is preferably 10 parts by mass or less, more preferably 0.001 to 5 parts by mass, and particularly preferably 0.005 to 3 parts by mass, based on 100 parts by mass of the resin (A). If the content of the acid diffusion controller exceeds 10 parts by mass, the acid diffusion controller may be eluted into the immersion medium, and may contaminate the lens of the exposure system.

2. Resist Pattern-Forming Method

A resist pattern-forming method according to one embodiment of the invention includes the following steps (1) to (4). The details of the resist pattern-forming method are described below.

2-1. Step (1)

The step (1) includes applying a photoresist composition to a substrate to form a photoresist film.

A silicon wafer, an aluminum-coated wafer, or the like may be used as the substrate. An organic or inorganic antireflective film may be formed on the substrate (see Japanese Patent Publication (KOKOKU) No. 6-12452, for example) in order to maximize the potential of the resist film.

A known photoresist composition may be used as the photoresist composition. The photoresist composition may be prepared by dissolving a resin, a photoacid generator, and the like for forming a photoresist film in an appropriate solvent so that the solid content is 0.1 to 20 mass %, and filtering the solution through a filter having a pore size of about 30 nm, for example. A commercially available photoresist solution may be used as the photoresist composition.

The resist pattern-forming method according to one embodiment of the invention preferably utilizes a positive-tone photoresist composition. A chemically-amplified positive-tone photoresist is designed so that an acid-dissociable group included in a polymer dissociates due to an acid generated by a photoacid generator upon exposure to produce a carboxyl group, for example. As a result, the solubility of the exposed area of the photoresist film in a developer (alkaline aqueous solution) increases. Therefore, the exposed area is dissolved (removed) in the developer to obtain a positive-tone resist pattern.

The photoresist film may be formed by applying the photoresist composition to the substrate by an appropriate application method (e.g., spin coating, cast coating, or roll coating), and pre-baking (PB) the applied photoresist composition to volatilize the solvent. Note that PB may be omitted. The thickness of the photoresist film may be appropriately adjusted, but is normally 0.01 to 2 μm.

2-2. Step (2)

The step (2) includes applying the upper-layer film-forming composition to the photoresist film to form an upper-layer film on the photoresist film.

The upper-layer film may be formed by applying the upper-layer film-forming composition to the photoresist film by an appropriate application method (e.g., spin coating, cast coating, or roll coating), and firing (drying) the applied upper-layer film-forming composition. Note that the firing operation may be omitted. The thickness of the upper-layer film is preferably an odd multiple of λ/4 n (where, λ is the wavelength of radiation, and n is the refractive index of the upper-layer film).

2-3. Step (3)

The step (3) includes exposing the upper-layer film and the photoresist film by applying radiation to the upper-layer film and the photoresist film via an immersion medium disposed on the upper-layer film and a mask having a given pattern.

Specific examples of the immersion medium include purified water, pH-adjusted water, a high-refractive-index liquid, and the like. Among these, purified water is particularly preferable.

Radiation used for exposure may be appropriately selected depending on the combination of the photoresist film and the upper-layer film. Examples of radiation include visible rays, ultraviolet rays such as a g-line and an i-line, deep ultraviolet rays such as ArF excimer laser light and KrF excimer laser light, X-rays such as synchrotron radiation, charged particle rays such as electron beams, and the like. Among these, ArF excimer laser light (wavelength: 193 nm) and KrF excimer laser light (wavelength: 248 nm) are preferable.

It is preferable to perform post-exposure bake (hereinafter abbreviated as "PEB") in order to improve the resolution, the pattern shape, the developability, and the like of the photoresist film. The PEB temperature is appropriately adjusted depending on the type of the photoresist and the like, but is normally about 30 to about 200° C., and preferably 50 to 150° C.

2-4. Step (4)

The step (4) includes developing the upper-layer film and the photoresist film that have been exposed using a developer to form a resist pattern. In the step (4), the exposed area of the upper-layer film and the photoresist film is dissolved (removed) in the developer. After development, the upper-layer film and the photoresist film are normally washed with water, and dried.

Examples of the developer include an alkaline aqueous solution prepared by dissolving sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, 1,5-diazabicyclo-[4.3.0]-5-nonane, or the like in water. Note that an appropriate amount of a water-soluble organic solvent (e.g., alcohol such as methanol or ethanol) or a surfactant may be added to the developer.

EXAMPLES

The invention is further described below by way of examples. Note that the invention is not limited to the following examples. The property value measuring methods and the property evaluation methods employed in the examples are described below.

Solid Content (Mass %) of Resin Solution 0.3 g of the resin solution was weighed on an aluminum dish, and heated at 140° C. for 1 hour on a hot plate. The solid content (mass %) was calculated from the mass of the resin solution before heating and the mass of the residue obtained after heating. The solid content was utilized for preparation of the upper-layer film-forming composition and calculation of the yield.

Mass Average Molecular Weight (Mw) and Number Average Molecular Weight (Mn)

The mass average molecular weight (Mw) and the number average molecular weight (Mn) were determined by gel permeation chromatography (GPC) (standard: monodisperse polystyrene) using GPC columns (G2000 HXL×2, G3000HXL×1, G4000HXL×1 (manufactured by Tosoh Corp.)) (flow rate: 1.0 ml/min, eluant: tetrahydrofuran, column temperature: 40° C.).

$^{13}$C-NMR Analysis

Each resin was subjected to $^{13}$C-NMR analysis using a nuclear magnetic resonance spectrometer ("JNM-ECX400" manufactured by JEOL Ltd.).

Receding Contact Angle (°)

The upper-layer film-forming composition of each example was spin-coated onto an 8-inch silicon wafer at 1500 rpm for 60 seconds using a semiconductor production system ("CLEAN TRACK ACT12" manufactured by Tokyo Electron Ltd.), and pre-baked (PB) at 90° C. for 60 seconds to form a film (thickness: 30 nm). The silicon wafer was then placed on the wafer stage of a contact angle meter ("DSA-10" manufactured by KRUS). The position of the needle of the contact angle meter was adjusted to a position (initial position) at which a water droplet can be formed on the film formed on the wafer. Water was discharged from the needle to form a water droplet (25 μl), and the needle was withdrawn from the water droplet. The needle was then lowered so that the tip of the needle entered the water droplet, and disposed at the initial position. The water droplet was sucked through the needle for 90 seconds at a rate of 10 μl/min, and the contact angle formed by the film and the liquid surface was measured every second. The average value of twenty measured values (20 seconds) after the measured value became stable was calculated, and taken as the receding contact angle (°). The receding contact angle was measured at room temperature (the temperature of water was 23° C.).

Drying within Nozzle

A 12-inch silicon wafer was subjected to a hexamethyldisilazane (HMDS) treatment at 100° C. for 60 seconds using a semiconductor production system ("CLEAN TRACK ACT12" manufactured by Tokyo Electron Ltd.). The upper-layer film-forming composition of each example was spin-coated onto the silicon wafer at 1500 rpm for 30 seconds using the above semiconductor production system (cyclohexanone was used as a solvent bath thinner), and pre-baked (PB) at 90° C. for 60 seconds to form a film (thickness: 30 nm). The number of coating defects in the film was measured using a wafer defect inspection system ("KLA2351" manufactured by KLA-Tencor Corp.) to confirm that the number of coating defects was 100 or less.

The upper-layer film-forming composition of each example for which the number of coating defects was 100 or less, was installed in the above semiconductor production system. After 30 minutes had elapsed, the upper-layer film-forming composition of each example was spin-coated onto a 12-inch silicon wafer (subjected to an HMDS treatment) at 1500 rpm for 60 seconds without performing dummy dispensing, and prebaked (PB) at 90° C. for 60 seconds to form a film (thickness: 30 nm). The number of coating defects in the film was measured using the above wafer defect inspection system. A case where the number of coating defects was 100 or less was evaluated as "Acceptable", and a case where the number of coating defects was more than 100 was evaluated as "Unacceptable".

Coating Defects

A 12-inch silicon wafer was subjected to a hexamethyldisilazane (HMDS) treatment at 100° C. for 60 seconds using a semiconductor production system ("CLEAN TRACK ACT12" manufactured by Tokyo Electron Ltd.). The upper-layer film-forming composition of each example was spin-coated onto the silicon wafer at 1500 rpm for 30 seconds using the above semiconductor production system (cyclohexanone was used as a solvent bath thinner), and pre-baked (PB) at 90° C. for 60 seconds to form a substrate on which an upper-layer film (thickness: 300 nm) was formed. After breaking the substrate, the upper-layer film in the section of the substrate was observed using a scanning electron microscope ("S-4800" manufactured by Hitachi High-Technologies Corporation). A pinhole defect and repelling were counted as the coating defects. A case where the number of coating defects was 1 or less was evaluated as "Acceptable", and a case where the number of coating defects was 2 or more was evaluated as "Unacceptable".

Synthesis Example 1

Production of Resin (A-1)

A monomer solution (1) was prepared by dissolving 17.43 g of (1,1,1,3,3,3-hexafluoro-2-propyl)methacrylate and 4.25 g of 2,2-azobis(methyl 2-methylpropionate) in 25 g of methyl ethyl ketone, and a monomer solution (2) was prepared by dissolving 27.74 g of (1,1,1-trifluoro-2-trifluoromethyl-2-hydroxy-4-pentyl)methacrylate in 25 g of methyl ethyl ketone. A three-necked flask (500 ml) equipped with a thermometer and a dropping funnel was charged with 100 g of methyl ethyl ketone, and purged with nitrogen for 30 minutes. The inside of the flask was then heated to 80° C. with stirring using a magnetic stirrer. The monomer solution (1) was then added dropwise to the flask using the dropping funnel over 20 minutes, and aged for 20 minutes. The monomer solution (2) was then added dropwise to the flask over 20 minutes. The mixture was reacted for 1 hour, and cooled to 30° C. or less to obtain a copolymer solution.

The copolymer solution was concentrated to 150 g, and put in a separating funnel. 50 g of methanol and 400 g of n-hexane were added to the separating funnel to effect separation and purification. The lower layer was collected, and substituted with 4-methyl-2-pentanol to obtain a resin solution containing a resin (A-1). The solid content of the resin solution was 20 mass %. The repeating units shown by the following formula (A-1) were included in the resin (A-1).

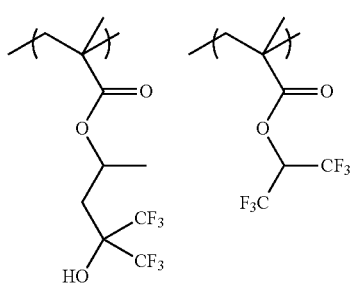

(A-1)

The resin (A-1) had an Mw of 5730 and a ratio "Mw/Mn" of 1.23. The yield was 26%. The content of the repeating unit derived from (1,1,1,3,3,3-hexafluoro-2-propyl)methacrylate and the content of the repeating unit derived from (1,1,1-trifluoro-2-trifluoromethyl-2-hydroxy-4-pentyl)methacrylate in the resin (A-1) were 61.1 mol % and 38.9 mol %, respectively.

Synthesis Example 2

Production of Resin (A-2)

46.95 g (85 mol %) of (1,1,1-trifluoro-2-trifluoromethyl-2-hydroxy-4-pentyl)methacrylate and 6.91 g of 2,2'-azobis (methyl 2-methylpropionate) (initiator) were dissolved in 100 g of isopropyl alcohol (IPA) to prepare a monomer solution. A three-necked flask (500 ml) equipped with a thermometer and a dropping funnel was charged with 50 g of IPA, and purged with nitrogen for 30 minutes. The inside of the flask was then heated to 80° C. with stirring using a magnetic stirrer. The monomer solution was then added dropwise to the flask using the dropping funnel over 2 hours. After the addition, the mixture was reacted for 1 hour. 10 g of an IPA solution of 3.05 g (15 mol %) of vinylsulfonic acid was then added dropwise to he flask over 30 minutes. The mixture was then reacted for 1 hour. The mixture was then cooled to 30° C. or less to obtain a copolymer solution.

The copolymer solution was concentrated to 150 g, and put in a separating funnel. 50 g of methanol and 600 g of n-hexane were added to the separating funnel to effect separation and purification. The lower layer was then collected, and diluted with IPA so that the amount of the mixture was 100 g. The mixture was then put in a separating funnel. 50 g of methanol and 600 g of n-hexane were added to the separating funnel to effect separation and purification. The lower layer was then collected, and substituted with 4-methyl-2-pentanol so that the total amount of the mixture was 250 g. The mixture was then put in a separating funnel. 250 g of water was added to the separating funnel to effect separation and purification. The upper layer was then collected, and substituted with 4-methyl-2-pentanol to obtain a resin solution containing a resin (A-2). The solid content of the resin solution was 25 mass %. The repeating units shown by the following formula (A-2) were included in the resin (A-2).

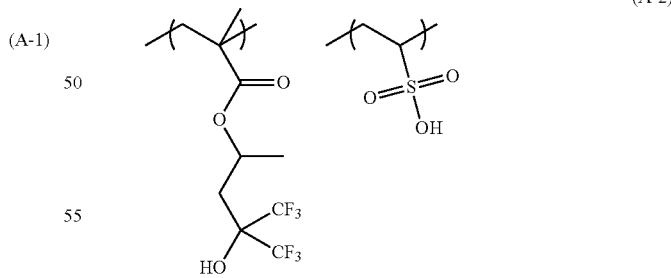

(A-2)

The resin (A-2) had an Mw of 9760 and a ratio "Mw/Mn" of 1.51. The yield was 65%. The content of the repeating unit derived from (1,1,1,3,3,3-hexafluoro-2-propyl)methacrylate and the content of the repeating unit derived from vinylsulfonic acid in the resin (A-2) were 95.0 mol % and 5.0 mol %, respectively.

Synthesis Example 3

Production of Photoresist Composition 53.93 g (50 mol %) of a monomer (M-1) shown by the following formula (M-1), 35.38 g (40 mol %) of a monomer (M-2) shown by the following formula (M-2), and 10.69 g (10 mol %) of a monomer (M-3) shown by the following formula (M-3) were dissolved in 200 g of 2-butanone. 5.58 g of dimethyl 2,2'-azobis(2-methylpropionate) was added to the solution to prepare a monomer solution. A three-necked flask (500 ml) equipped with a thermometer and a dropping funnel was charged with 100 g of 2-butanone, and purged with nitrogen for 30 minutes. The inside of the flask was then heated to 80° C. with stirring using a magnetic stirrer. The monomer solution was then added dropwise to the flask using the dropping funnel over 3 hours. The monomers were polymerized for 6 hours from the start of addition of the monomer solution. After completion of polymerization, the polymer solution was cooled with water to 30° C. or less. The polymer solution was then added to 2000 g of methanol, and a precipitated white powder was collected by filtration. The white powder thus collected was washed twice with 400 g of methanol in a slurry state. The product was then collected by filtration, and dried at 50° C. for 17 hours to obtain a white powdery copolymer. The amount of the copolymer was 74 g, and the yield was 74%.

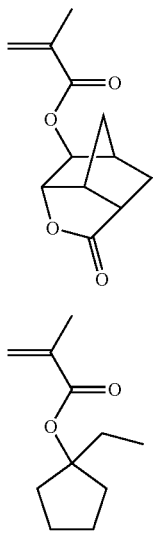

(M-1)

(M-2)

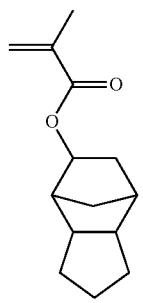

(M-3)

The copolymer had an Mw of 6900 and a ratio "Mw/Mn" of 1.70. The ratio of the repeating unit derived from the monomer (M-1), the repeating unit derived from the monomer (M-2), and the repeating unit derived from the monomer (M-3) determined by $^{13}$C-NMR analysis was 53.0:37.2:9.8 (mol %).

100 parts by mass of the copolymer, 1.5 parts by mass of triphenylsulfonium nonafluoro-n-butanesulfonate, 6 parts by mass of 1-(4-n-butoxynaphthalen-1-yl) tetrahydrothiophenium nonafluoro-n-butanesulfonate, 0.65 parts by mass of R-(+)-(tert-butoxycarbonyl)-2-piperidinemethanol, 2400 parts by mass of propylene glycol monomethyl ether acetate, and 30 parts by mass of γ-butyrolactone were mixed so that the total solid content was 0.2 to 20 mass %. The mixture was filtered through a filter having a pore size of 30 nm to obtain a photoresist composition.

Example 1

7 parts by mass of the resin (A-1) produced in Synthesis Example 1 (resin (A)), 93 parts by mass of the resin (A-2) produced in Synthesis Example 2 (resin (A)), 10 parts by mass of a solvent (B1-1) (dipropylene glycol dimethyl ether) (solvent (B1)), 10 parts by mass of 4-methyl-2-pentanol (MIBC) (solvent (B2)), and 90 parts by mass of diisoamyl ether (DIAE) (solvent (B3)) were mixed to obtain an upper-layer film-forming composition (Example 1). The upper-layer film-forming composition (Example 1) was evaluated as described above. The evaluation results for "Drying within nozzle" and "Coating defects" were "Acceptable". The evaluation result for "Drying within nozzle" when drying the upper-layer film-forming composition for 2 hours or more was also "Acceptable". The results are shown in Table 1.

Examples 2 and 3 and Comparative Examples 1 to 9

An upper-layer film-forming composition was produced, and evaluated in the same manner as in Example 1, except that conditions shown in Table 1 were used. The results are shown in Table 1.

TABLE 1

| | Resin (A) | | Solvent component (B) | | | | | | Receding contact angle (°) | Drying within nozzle | | Coating defects |
| | | | Solvent (B1) | | Solvent (B2) | | Solvent (B3) | | | | | |
| | Type | (parts by mass) | Type | (parts by mass) | Type | (parts by mass) | Type | (parts by mass) | | Drying time | Evaluation | |
|---|---|---|---|---|---|---|---|---|---|---|---|---|
| Example 1 | (A-1) (A-2) | 7 93 | (B1-1) | 10 | MIBC | 10 | DIAE | 80 | 74 | >2 h | Acceptable | Acceptable |
| Example 2 | (A-1) (A-2) | 7 93 | (B1-2) | 15 | MIBC | 10 | DIAE | 75 | 74 | >2 h | Acceptable | Acceptable |
| Example 3 | (A-1) (A-2) | 7 93 | (B1-2) | 10 | MIBC | 10 | DIAE | 80 | 74 | >2 h | Acceptable | Acceptable |
| Comparative Example 1 | (A-1) (A-2) | 7 93 | (B1-3) | 10 | MIBC | 10 | DIAE | 80 | 74 | >2 h | Acceptable | Unacceptable |

TABLE 1-continued

| | Resin (A) | | Solvent component (B) | | | | | | Receding contact angle (°) | Drying within nozzle | | Coating defects |
|---|---|---|---|---|---|---|---|---|---|---|---|---|
| | | | Solvent (B1) | | Solvent (B2) | | Solvent (B3) | | | | | |
| | Type | (parts by mass) | Type | (parts by mass) | Type | (parts by mass) | Type | (parts by mass) | | Drying time | Evaluation | |
| Comparative Example 2 | (A-1) (A-2) | 7 93 | (B1-4) | 10 | MIBC | 10 | DIAE | 80 | 74 | >2 h | Acceptable | Unacceptable |
| Comparative Example 3 | (A-1) (A-2) | 7 93 | (B1-5) | 10 | MIBC | 10 | DIAE | 80 | 74 | >2 h | Acceptable | Unacceptable |
| Comparative Example 4 | (A-1) (A-2) | 7 93 | (B1-6) | 10 | MIBC | 10 | DIAE | 80 | 74 | >2 h | Acceptable | Unacceptable |
| Comparative Example 5 | (A-1) (A-2) | 7 93 | — | — | MIBC | 20 | DIAE | 80 | 72 | 30 min | Unacceptable | Acceptable |
| Comparative Example 6 | (A-1) (A-2) | 7 93 | — | — | MIBC | 60 | DIAE | 40 | 72 | 30 min | Unacceptable | Acceptable |
| Comparative Example 7 | (A-1) (A-2) | 7 93 | (B1-7) | 10 | MIBC | 10 | DIAE | 80 | 74 | 30 min | Unacceptable | Unacceptable |
| Comparative Example 8 | (A-1) (A-2) | 7 93 | (B1-8) | 10 | MIBC | 10 | DIAE | 80 | 74 | 30 min | Unacceptable | Unacceptable |
| Comparative Example 9 | (A-1) (A-2) | 7 93 | (B1-9) | 10 | MIBC | 10 | DIAE | 80 | 74 | 30 min | Unacceptable | Unacceptable |

The details of the solvents (B1-1) to (B1-9) shown in Table 1 are given below together with the boiling point (° C.) at 101.3 kPa and the static surface tension (mN/m).

Solvent (B1-1): dipropylene glycol dimethyl ether (171° C., 21.1 mN/m)
Solvent (B1-2): ethylene glycol monoisobutyl ether (161° C., 22.5 mN/m)
Solvent (B1-3): diethylene glycol monoethyl ether acetate (217° C., 26.2 mN/m)
Solvent (B1-4): ethylene glycol monobutyl ether acetate (188° C., 24.0 mN/m)
Solvent (B1-5): diethylene glycol diethyl ether (189° C., 23.3 mN/m)
Solvent (B1-6): dipropylene glycol monomethyl ether (187° C., 25.1 mN/m)
Solvent (B1-7): tripropylene glycol monomethyl ether (242° C., 25.7 mN/m)
Solvent (B1-8): dipropylene glycol mono-n-butyl ether (231° C., 23.7 mN/m)
Solvent (B1-9): ethylene glycol monoisopropyl ether (142° C., 22.9 mN/m)

As is clear from Table 1, the upper-layer film-forming composition including the resin (A) that is soluble in an alkaline aqueous solution, and includes a fluorine atom, and the solvent (B1) having a boiling point at 101.3 kPa of 150° C. or more and a static surface tension of 23.0 mN/m or less, suppressed drying within the nozzle and coating defects.

Industrial Applicability

The upper-layer film-forming composition according to the invention is very useful as a material for an upper-layer film that protects a photoresist film used for photolithography that utilizes liquid immersion lithography.

The invention claimed is:

1. An upper-layer film-forming composition comprising:
(A) a resin that is soluble in an alkaline aqueous solution, and includes a fluorine atom; and
(B) a solvent component comprising:
(B1) a solvent having a boiling point at 101.3 kPa of 150 to 180° C. and a static surface tension of 21.0 to 23.0 mN/m, a content of the solvent (B1) being 1 to 15 mass% of an amount of the solvent component (B); and
(B2) a solvent shown by a following general formula (B2), (B3) a solvent shown by a following general formula (B3), or both thereof, $$R^1\text{—OH} \quad (B2)$$

wherein $R^1$ represents a linear, branched, or cyclic hydrocarbon group having 1 to 10 carbon atoms or a halogenated hydrocarbon group, $$R^2\text{—O—}R^3 \quad (B3)$$

wherein $R^2$ and $R^3$ individually represent a hydrocarbon group having 1 to 8 carbon atoms or a halogenated hydrocarbon group, wherein the upper-layer film-forming composition is used to form an upper-layer film on a photoresist film,
wherein the solvent (B1) is shown by a following general formula (B1-1), $$R^4\text{—O}\!\left(\!\!\begin{array}{c}R^6\\|\\\phantom{x}\end{array}\!\!\text{O}\right)_{\!n}\!R^5 \quad (B1\text{-}1)$$

wherein n is an integer from 1 to 4, $R^4$ and $R^5$ individually represent a hydrogen atom, an alkyl group having 1 to 4 carbon atoms, or an acyl group, and $R^6$ represents a hydrogen atom or a methyl group.

2. The upper-layer film-forming composition according to claim 1, wherein the solvent component (B) includes (B2) a solvent shown by the following general formula (B2), $$R^1\text{—OH} \quad (B2)$$

wherein $R^1$ represents a linear, branched, or cyclic hydrocarbon group having 1 to 10 carbon atoms or a halogenated hydrocarbon group.

3. The upper-layer film-forming composition according to claim 1, wherein the solvent component (B) includes (B3) a solvent shown by the following general formula (B3), $$R^2\text{—O—}R^3 \quad (B\,3)$$

wherein $R^2$ and $R^3$ individually represent a hydrocarbon group having 1 to 8 carbon atoms or a halogenated hydrocarbon group.

4. The upper-layer film-forming composition according to claim 1, wherein the solvent (B1) is dipropylene glycol dimethyl ether or ethylene glycol monoisobutyl ether.

5. The upper-layer film-forming composition according to claim 1, wherein the resin (A) includes at least one repeating unit selected from the group consisting of a repeating unit that includes a group shown by the following general formula (a1), a repeating unit that includes a group shown by the following general formula (a2), a repeating unit that includes a group shown by the following general formula (a3), a repeating unit that includes a carboxyl group, and a repeating unit that includes a sulfo group, and has a polystyrene-reduced mass average molecular weight determined by gel permeation chromatography of 2000 to 100,000,

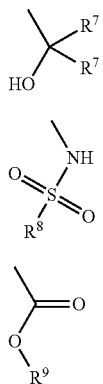

wherein $R^7$ individually represent a hydrogen atom, an alkyl group having 1 to 4 carbon atoms, or a fluoroalkyl group having 1 to 4 carbon atoms, provided that at least one of $R^7$ represents a fluoroalkyl group having 1 to 4 carbon atoms, $R^8$ represents a fluoroalkyl group having 1 to 20 carbon atoms, and $R^9$ represents a fluorohydrocarbon group or an organic group that includes a polar group.

6. The upper-layer film-forming composition according to claim 1, further comprising at least one of an acid and a photoacid generator.

7. A resist pattern-forming method comprising:
applying a photoresist composition to a substrate to form a photoresist film;
applying the upper-layer film-forming composition according to claim 1 to the photoresist film to form an upper-layer film on the photoresist film;
exposing the upper-layer film and the photoresist film by applying radiation to the upper-layer film and the photoresist film via an immersion medium disposed on the upper-layer film and a mask having a given pattern; and
developing the upper-layer film and the photoresist film that have been exposed using a developer to form a resist pattern.

8. The upper-layer film-forming composition according to claim 2, wherein the solvent component (B) further includes (B3) a solvent shown by the following general formula (B3), $$R^2\text{—O—}R^3 \tag{B3}$$

wherein $R^2$ and $R^3$ individually represent a hydrocarbon group having 1 to 8 carbon atoms or a halogenated hydrocarbon group.

* * * * *